United States Patent
Burak et al.

(10) Patent No.: US 8,896,395 B2
(45) Date of Patent: Nov. 25, 2014

(54) ACCOUSTIC RESONATOR HAVING MULTIPLE LATERAL FEATURES

(75) Inventors: Dariusz Burak, Fort Collins, CO (US);
Phil Nikkel, Loveland, CO (US); Chris Feng, Fort Collins, CO (US)

(73) Assignee: Avago Technologies General IP (Singapore) Pte. Ltd. (SG)

( * ) Notice: Subject to any disclaimer, the term of this patent is extended or adjusted under 35 U.S.C. 154(b) by 414 days.

(21) Appl. No.: 13/232,334

(22) Filed: Sep. 14, 2011

(65) Prior Publication Data

US 2013/0063227 A1 Mar. 14, 2013

(51) Int. Cl.
| H03H 9/00 | (2006.01) |
| H03H 9/13 | (2006.01) |
| H03H 9/17 | (2006.01) |
| H03H 9/02 | (2006.01) |
| H03H 9/15 | (2006.01) |

(52) U.S. Cl.
CPC .............. *H03H 9/132* (2013.01); *H03H 9/131* (2013.01); *H03H 9/173* (2013.01); *H03H 9/02086* (2013.01)
USPC .......................................... 333/187; 333/191

(58) Field of Classification Search
USPC ................... 333/187, 188, 189, 191; 310/365
See application file for complete search history.

(56) References Cited

U.S. PATENT DOCUMENTS

| 5,587,620 | A | 12/1996 | Ruby et al. |
| 5,873,153 | A | 2/1999 | Ruby et al. |
| 6,107,721 | A | 8/2000 | Lakin |
| 6,507,983 | B1 | 1/2003 | Ruby et al. |
| 7,140,084 | B2 | 11/2006 | Yamada et al. |
| 7,275,292 | B2 | 10/2007 | Ruby et al. |
| 7,280,007 | B2 | 10/2007 | Feng et al. |
| 7,345,410 | B2 | 3/2008 | Grannen et al. |
| 7,358,831 | B2 | 4/2008 | Larson, III et al. |
| 7,369,013 | B2 * | 5/2008 | Fazzio et al. ................... 333/187 |
| 7,388,454 | B2 | 6/2008 | Ruby et al. |
| 7,629,865 | B2 | 12/2009 | Ruby |
| 7,714,684 | B2 | 5/2010 | Ruby et al. |
| 2004/0017130 | A1 * | 1/2004 | Wang et al. .................... 310/311 |
| 2007/0205850 | A1 | 9/2007 | Jamneala et al. |
| 2010/0327697 | A1 | 12/2010 | Choy et al. |
| 2010/0327994 | A1 | 12/2010 | Choy et al. |

FOREIGN PATENT DOCUMENTS

WO 2004055982 A1 7/2004

OTHER PUBLICATIONS

Co-pending U.S. Appl. No. 13/036,489, filed Feb. 28, 2011.
Co-pending U.S. Appl. No. 13/074,094, filed Mar. 29, 2011.

* cited by examiner

*Primary Examiner* — Dean O Takaoka

(57) ABSTRACT

A thin film bulk acoustic resonator (FBAR) includes a first electrode stacked on a substrate over a cavity, a piezoelectric layer stacked on the first electrode, and a second electrode stacked on the piezoelectric layer. Multiple lateral features are formed on a surface of the second electrode, the lateral features including multiple stepped structures.

20 Claims, 6 Drawing Sheets

ACCOUSTIC RESONATOR HAVING MULTIPLE LATERAL FEATURES

BACKGROUND

Transducers generally convert electrical signals to mechanical signals or vibrations, and/or mechanical signals or vibrations to electrical signals. Acoustic transducers, in particular, convert electrical signals to acoustic signals (sound waves) and convert received acoustic waves to electrical signals via inverse and direct piezoelectric effect. Acoustic transducers generally include acoustic resonators, such as thin film bulk acoustic resonators (FBARs), surface acoustic wave (SAW) resonators or bulk acoustic wave (BAW) resonators, and may be used in a wide variety of electronic applications, such as cellular telephones, personal digital assistants (PDAs), electronic gaming devices, laptop computers and other portable communications devices. For example, FBARs may be used for electrical filters and voltage transformers. Generally, an acoustic resonator has a layer of piezoelectric material between two conductive plates (electrodes), which may form a thin membrane. FBAR devices, in particular, generate longitudinal acoustic waves and lateral (or transverse) acoustic waves when stimulated by an applied time-varying electric field, as well as higher order harmonic mixing products. The lateral modes and the higher order harmonic mixing products may have a deleterious impact on functionality.

In certain configurations, a frame may be provided along one or more sides of an FBAR to mitigate acoustic losses at the boundaries by improving the confinement of electrically excited modes in the active region of the FBAR (the region of overlap of the top electrode, the piezoelectric layer, and the bottom electrode). In general, frames create an acoustic impedance mismatch that reduces losses by suppressing excitation and thus minimizing scattering of FBAR modes at the edges of the electrodes (predominantly the top electrode). Also, frames reflect electrically excited propagating modes back to the active area of the resonator, and therefore improve confinement of these modes within the active region of the FBAR. Frames located along the sides of FBARs generally increase parallel resistance (Rp). A typical frame provides two interfaces (impedance miss-match planes), which increase reflection of propagating eigenmodes in lateral directions. When the width of the frame is properly designed for a given eigenmode, it results in resonantly enhanced reflection and suppression of that particular eigenmode, thus yielding better energy confinement and higher Q-factor at parallel resonant frequency (Fp).

However, better acoustic energy confinement, as well as further improvements in FBAR Q-factor due to the better acoustic energy confinement, are needed for increased efficiency of FBARs.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
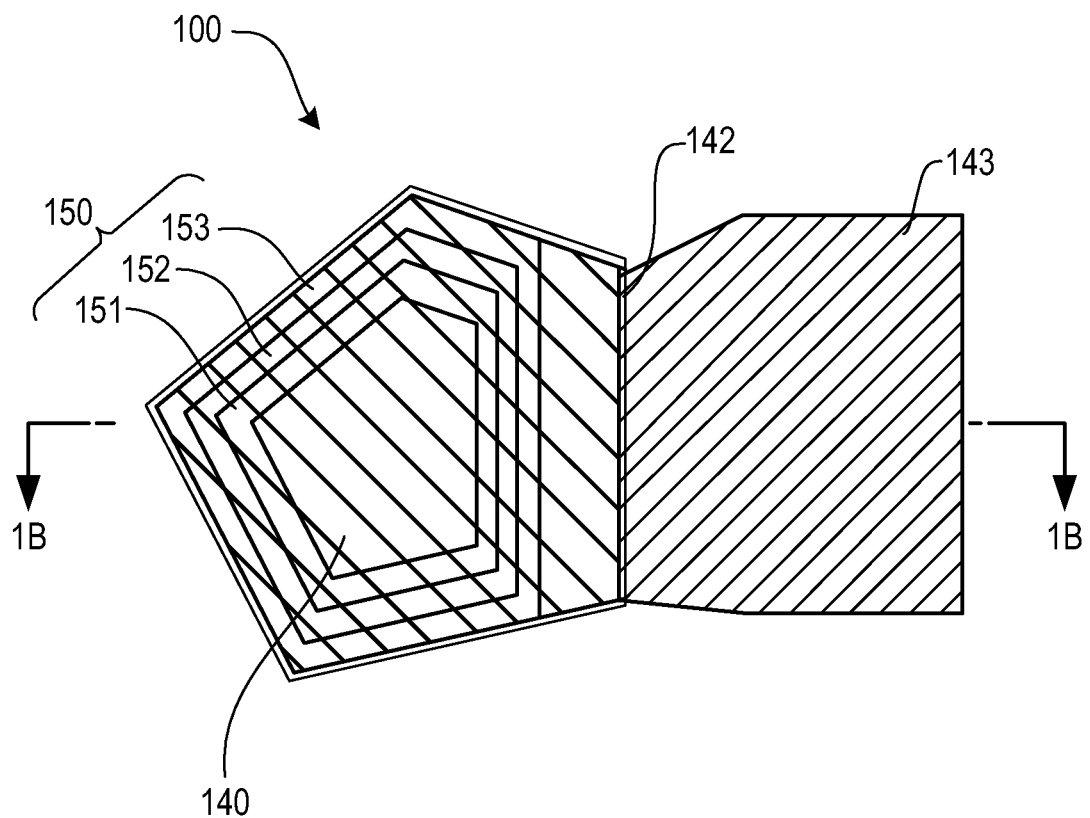
FIG. 1A is a top plan view illustrating a thin film bulk acoustic resonator (FBAR) including an outer multi-interface frame pattern with stepped structures, according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

Further, as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

The present teachings are directed to structures or frames having multiple lateral interfaces formed along a top electrode of a resonator. The multiple lateral interfaces provide improved selected mode confinement and/or suppression, thus enabling maximization of performance parameters, including quality factor (Qsw) for frequencies bellow series resonance frequency (Fs) and one of parallel resistance (Rp) at the parallel resonance frequency (Fp) or series resistance (Rs) at Fs. Two examples of the multi-interface frames generally include outer and inner raised region multi-step configurations, described below, which are configured for optimization of Rp (thicker than the main membrane region) and/or Rs (thinner than the main membrane region). The multi-step configuration includes stacked structures having steps of varying (e.g., decreasing) widths, which are either perfectly tuned (meaning that their widths are substantially equal to quarter-wavelength of the main propagating mode at a frequency of interest) or chirped (meaning that their widths do not satisfy a quarter-wavelength condition).

Certain aspects of the present teachings build upon components of FBAR devices, FBAR-based filters, their materials and methods of fabrication. Many details of FBARs, materials thereof and their methods of fabrication may be found in one or more of the following U.S. patents and patent applications: U.S. Pat. No. 6,107,721 (Aug. 22, 2000) to Lakin; U.S. Pat. No. 5,587,620 (Dec. 24, 1996), U.S. Pat. No. 5,873,153 (Feb. 23, 1999) U.S. Pat. No. 6,507,983 (Jan. 21, 2003) and U.S. Pat. No. 7,388,454 (Jun. 17, 2008) to Ruby, et al.; U.S. Pat. No. 7,629,865 (Dec. 8, 2009) to Ruby; U.S. Pat. No. 7,714,684 (May 11, 2010) to Ruby et al.; U.S. Pat. No. 7,280,007 (Oct. 9, 2007) to Feng et al.; U.S. Pat. App. Pub. No. 2007/0205850, entitled "Piezoelectric Resonator Structures and Electrical Filters having Frame Elements" to Jamneala et al.; U.S. Pat. App. Pub. No. 2010/0327697, entitled "Acoustic Resonator Structure Comprising a Bridge" to Choy et al.; U.S. Pat. App. Pub. No. 2010/0327994, entitled "Acoustic Resonator Structure having an Electrode with a Cantilevered Portion" to Choy et al.; and U.S. patent application Ser. No. 13/036,489, entitled "Coupled Resonator Filter Comprising a Bridge" to Burak filed on Feb. 28, 2011. The disclosures of these patents and patent applications are hereby incorporated by reference. It is emphasized that the components, materials and method of fabrication described in these patents and patent applications are representative and other methods of fabrication and materials within the purview of one of ordinary skill in the art are contemplated.

FIG. 1A shows a top view of FBAR 100 in accordance with a representative embodiment. The FBAR 100 includes a top electrode 140 having five (5) sides, with a connection side 142 configured to provide an electrical connection to interconnect 143. The interconnect 143 provides electrical signals to the top electrode 140 to excite desired acoustic waves in a piezoelectric layer (not shown in FIG. 1A) of the FBAR 100. The FBAR 100 further includes lateral features configured to reflect and suppress at least a portion of the thickness extensional (TE) propagating lateral acoustic modes excited by the electric field and to facilitate exponential decay of TE evanescent modes also excited by the time-harmonic electric field. According to a representative embodiment, the lateral features include a frame, indicated as outer multi-interface frame pattern 150, comprising multiple interfaces, indicated by representative layers or stepped structures 151-153, discussed below with reference to FIGS. 1B and 1C. Stepped structures generally refer to adjacent layers (e.g., stepped structures 151 and 152 and/or stepped structures 152 and 153) having different widths from one another, forming a corresponding vertical interface.

Figure 1B:
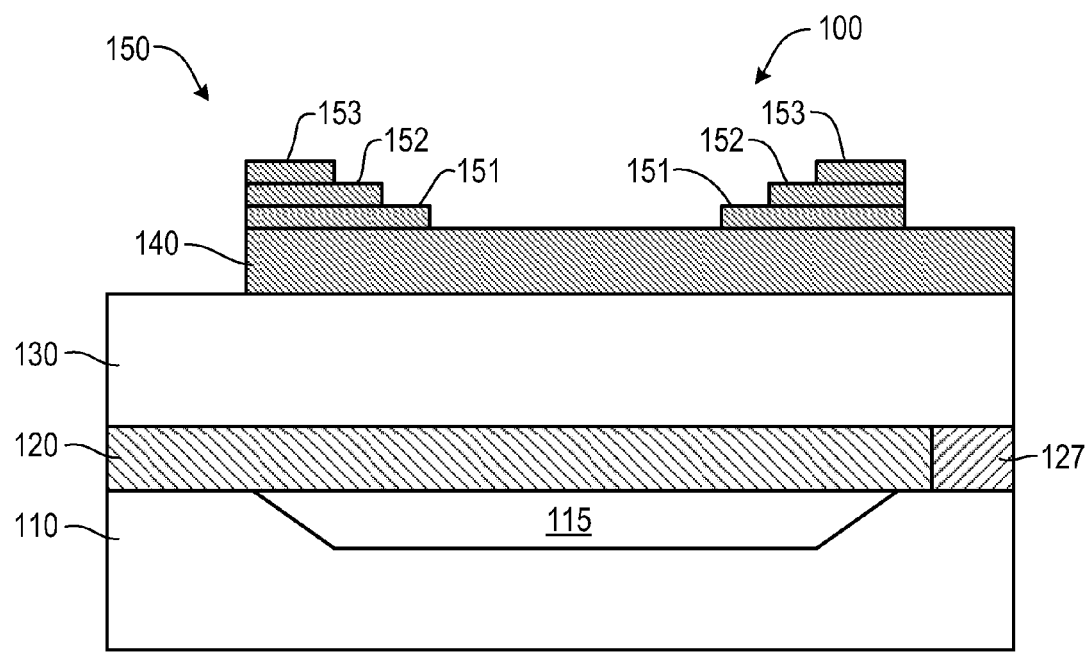
FIGS. 1B-1C are cross-sectional diagrams illustrating the FBAR of FIG. 1A, according to representative embodiments.

FIG. 1B shows a cross-sectional view of the FBAR 100 taken along line 1B-1B of FIG. 1A in accordance with a representative embodiment. FIG. 1B is a cross-sectional view zoomed in on a portion of outer multi-interface frame pattern 150 of FIG. 1B. The FBAR 100 includes multiple layers stacked over substrate 110 having a cavity 115 for reflection of acoustic waves. The inclusion of the cavity 115 in the FBAR 100 is merely illustrative. In various alternative configurations, a known acoustic reflector (e.g., a Bragg mirror (not shown)) comprising alternating layers of high and low acoustic impedance may be provided in the substrate 110 to provide acoustic isolation, without departing from the scope of the present teachings. The substrate 110 may be formed of a material compatible with semiconductor processes, such as silicon (Si), gallium arsenide (GaAs), indium phosphide (InP), glass, sapphire, alumina, or the like, for example.

A first or bottom electrode 120 is disposed over the substrate 110 and partially over the cavity 115. A planarization layer 127 is also provided over the substrate 110 as shown. In a representative embodiment, the planarization layer 127 includes non-etchable borosilicate glass (NEBSG), for example. In general, the planarization layer 127 does not need to be present in the structure (as it increases overall processing cost), but when present, it may improve quality of growth of subsequent layers and simplify their processing. A piezoelectric layer 130 is disposed over the bottom electrode 120, and a second or top electrode 140 (shown in FIG. 1A) is disposed over the piezoelectric layer 130.

As should be appreciated by one of ordinary skill in the art, the structure provided by the bottom electrode 120, the piezoelectric layer 130 and the top electrode 140 is a bulk acoustic wave (BAW) resonator. When the BAW resonator is disposed over a cavity (e.g., the cavity 115), it is a so-called FBAR (e.g., FBAR 100); and when the BAW resonator is disposed over an acoustic reflector (e.g., Bragg mirror), it is a so-called solidly mounted resonator (SMR). The present teachings contemplate the use of either FBARs or SMRs in a variety of applications, including filters (e.g., ladder filters comprising a plurality of BAW resonators). However, the effects related to the confinement of TE evanescent modes of the multi-interface frame pattern 150 on Rp and Rs of the FBAR 100, discussed below, are generally opposite to the effects on Rp and Rs of an SMR, as would be appreciated by one of ordinary skill in the art. On the other hand, the effects related to the confinement of TE propagating modes of the outer multi-interface frame pattern 150 on Rp and Rs of the FBAR 100, discussed below, are generally similar to the effects on Rp and Rs of an SMR.

The bottom and top electrodes 120 and 140 are formed of electrically conductive materials, such as tungsten (W), molybdenum (Mo) or copper (Cu), and the piezoelectric layer 130 is formed of a thin film of piezoelectric material, such as zinc oxide (ZnO), aluminum nitride (AlN) or lead zirconium titanate (PZT), although other materials may be incorporated without departing from the scope of the present teachings. In various embodiments, the bottom and top electrodes 120 and 140 may be formed of the same or different materials from one another. Also, in various embodiments, the bottom and top electrodes 120 and 140 may have the same or different thicknesses from one another. The respective thicknesses of the bottom and top electrodes 120 and 140, and of the piezoelectric layer 130, may vary to provide unique benefits for any particular situation or to meet application specific design requirements of various implementations.

The FBAR 100 also includes outer multi-interface frame pattern 150 formed on or otherwise extending from the top surface of the top electrode 140. The outer multi-interface frame pattern 150 is formed in an outer region of the top electrode 140, and includes multiple stepped structures 151-153. The outer region of the top electrode 140 generally includes portions of the top electrode at and/or near an outer perimeter of the top electrode 140. The outer region may extend toward (but not include) a central region of the FBAR 100 by various amounts, depending on application specific design requirements of various implementations, for example. The central region generally includes a portion of the top electrode 140 that incorporates the center of the active region of the FBAR 100. In the depicted representative embodiment, the first stepped structure 151 is stacked on the top surface of the top electrode 140, the second stepped structure 152 is stacked on the first stepped structure 151, and the third stepped structure 153 is stacked on the second stepped structure 152, forming a stair step pattern extending from an inner edge to an outer edge of the outer multi-interface frame pattern 150. In various alternative configurations, the outer multi-interface frame pattern 150 may include any number of stepped structures from two to N steps, without departing from the scope of the present teachings.

Figure 1C:
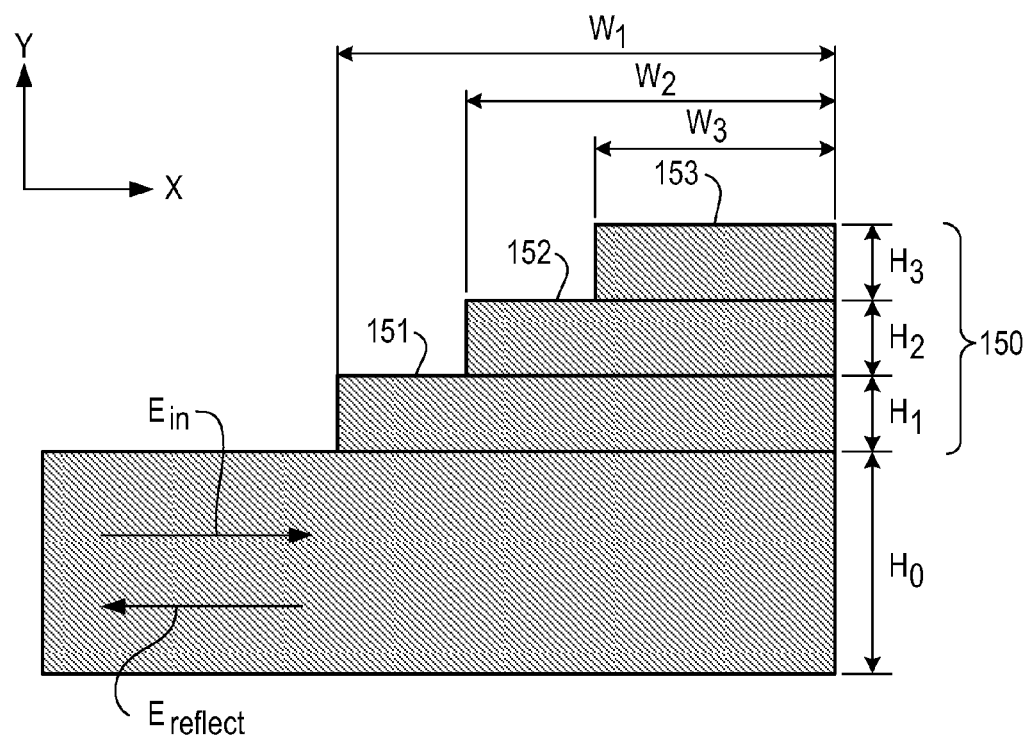

Referring to FIG. 1C, the top electrode 140 has height $H_0$ (step thickness) in the y-axis direction, and the first through third stepped structures 151-153 have corresponding heights first through third heights $H_1$ to $H_3$, respectively. In the depicted representative embodiment, first height $H_1$=second height $H_2$=third height $H_3$, although the heights may differ in order to provide unique benefits for any particular situation or to meet application specific design requirements of various implementations. For example, in alternative configurations, each of the first through third stepped structures 151-153 may have different heights, such that first height $H_1$>second height $H_2$>third height $H_3$, for example, or first height $H_1$<second height $H_2$<third height $H_3$. Each of the first through third heights $H_1$ to $H_3$ may be within a range of approximately 200 Å to about 5000 Å, for example. Likewise, the first through third stepped structures 151-153 have corresponding first through third widths $W_1$ to $W_3$ in the x-axis direction, respectively. The total width of the outer multi-interface frame pattern 150 is the same as the first width $W_1$ of the bottom stepped structure 151. To maintain a stair step pattern, as shown in the example, first width $W_1$>second width $W_2$>third width $W_3$.

In other alternative embodiments, the relative sizes of the stepped structures 151-153 in the multi-interface frame pattern 150 may differ, such that the multi-interface frame pattern 150 does not necessarily form an ascending stair step pattern. For example, referring to FIG. 1C, in an alternative representative embodiment the left edges of the second and third stepped structure 152 and 153 may be placed at the left edge of the first stepped structure, thus forming a descending stair step pattern when moving away from the center of the active region of FBAR 100. In another representative embodiment, the second stepped structure 152 may be placed in the middle of the first stepped structure 151, and the third stepped structure 153 may be placed in the middle of the second stepped structure, thus forming an ascending/descending stair step pattern when moving away from the center of the active region of FBAR 100. Of course, other alignments and arrangements of the stepped structures may be provided without departing from the scope of the present teachings.

In various embodiments, each of the first through third widths $W_1$ to $W_3$ is an odd multiple of a quarter wavelength (QWL) for the dominant TE propagating mode excited at a frequency most relevant for a specific application (for example at Fp). Notably, due to the steepness of the dispersion characteristics (that is frequency versus wavelength characteristics) of the dominant TE propagating mode, there usually exists a well defined QWL width for a whole range of frequencies between Fs and Fp that facilitates beneficial confinement and suppression of the electrically excited TE propagating mode. At the same time, progressively increasing the thickness of the multi-interface frame pattern 150 in the direction towards the edge of the device allows for smoother and faster decay of the electrically excited TE evanescent mode. That faster decay facilitates higher Rp by suppressing the scattering of TE evanescent mode at the edge of the outer multi-interface frame pattern 150 and electrode 140. Note that the edge of the top electrode 140 presents a large acoustic impedance discontinuity to both propagating and evanescent components of electrically excited piston mode. Beneficially, impact of this discontinuity on the acoustic waves can be minimized by suppressing the propagating component and exponentially decaying the evanescent component of the piston mode by multi-step frame (e.g., the first through third stepped structures 151-153).

Generally, at series resonance frequency Fs of the FBAR 100, electrical energy is transferred to the acoustic energy and vice-versa. While the electric field (and thus electric energy density) is confined to an active region under the top electrode 140, the acoustic field (and thus acoustic energy density) can be both confined to the region under the top electrode 140 (in the form of continuous modes) or can propagate away (in the form of a propagating eigenmode). The electric field profile is determined by the lateral shape of the top electrode 140, as typically the bottom electrode 120 extends beyond (in the x-z plane in the depicted coordinate system) the top electrode 140. Mathematically, the lateral shape of the electrical field in the active region can be represented as a Fourier superposition of plane waves propagating at different angles with respect to top or bottom interfaces of the piezoelectric layer 130 in the FBAR 100. It should be emphasized that this is purely a mathematical concept, since there are no physical electric field waves (other than associated with acoustic waves via piezoelectric effect) propagating in the structure. In other words, spatial spectrum of the electric field is given by a Fourier transform of an electric field profile. Each spatial spectral component of the electric field excites an acoustic plane wave propagating at the same angle with respect to top or bottom interfaces of piezoelectric layer 130. Unlike the electric field, which is confined vertically by the presence of the top and bottom electrodes 140, 120, the excited acoustic waves can propagate vertically through all the layers of the FBAR 100. However, in general, electrically excited acoustic plane waves cannot propagate freely beyond the active region of the FBAR 100 because of destructive interference of these acoustic plane waves upon the reflection from the interfaces defined by the layers of the structure and by the structure itself (that is top and bottom boundaries of the stack). These non-propagating waves form a set of so-called continuous modes. The continuous modes decay exponentially in the direction away from the excitation region. In this case the excitation region is defined by an overlap of top and bottom electrodes 140 and 120, enforcing the electric field in piezoelectric layer 130. However, for some spatial spectral components of the electric field, the excited acoustic waves interfere constructively upon reflections from the interfaces of the layer stack that comprise the FBAR 100. These acoustic plane waves can propagate freely in the lateral direction (x-z plane) away from the active region, and are therefore called propagating eigenmodes of the FBAR 100. As such, if these propagating modes are not confined to the active region or suppressed, deleterious loss of energy results. This loss of energy is manifest, for example, by a reduced Q-factor in the FBAR 100.

The Fourier superposition of plane waves excited under the top electrode 140 can be mathematically represented as a superposition of contributions from complex poles corresponding to propagating and evanescent eigenmodes for a given stack. The evanescent eigenmodes generally cannot propagate in the stack and decay exponentially from the point of excitation. Such a decomposition can be generally performed for any forced system, where forcing happens either through electrical excitation (like under the top electrode 140) or through mechanical excitation. The mechanical excitation occurs, for example, at an interface between two regions (e.g. at a vertical interface defined by the outside edge of top electrode 140 of the FBAR 100), where one region exhibits a known forcing motion, while the other region is passive and both regions are coupled through the continuity of stress and particle velocities at the interface between them. In the presence of the multi-interface frame pattern 150, electrical excitation of propagating and evanescent eigenmodes is minimized since, generally, such excitation is inversely proportional to the squared difference between excitation frequency and the series resonance frequency (or a cut-off frequency, if only mechanical excitation is considered) in a given region (for example, in the multi-interface frame pattern 150 region). Since the multi-interface frame pattern 150 presents a significant mass-load as compared to the central region of the FBAR 100, the series resonance frequency in that region is shifted down, resulting in significant suppression of electrical excitation of both kinds of modes.

In the FBAR 100, motion of the active region is electrically excited, whereas motion in the multi-interface frame pattern 150 is predominantly excited mechanically and results from boundary conditions at the vertical interface between a central region of FBAR 100 and the multi-interface frame pattern 150. At the interface with the first stepped structure 151, the electrically excited propagating eigenmode is reflected and also partially scattered into other unwanted modes (e.g., shear and flexural modes). However, part of the energy in that mode will convert into analogous thickness extensional propagating and evanescent modes supported by the first stepped structure 151. At the same time, the electrically excited evanescent mode will scatter at the interface with the first stepped structure 151, but it will also convert into analogous thickness extensional evanescent and propagating modes supported by the first stepped structure 151. This process will repeat at the vertical interface defined by the edge of the second stepped structure 152 and then at the vertical interface defined by the edge of the third stepped structure 153. Notably, scattering processes at the subsequent vertical interfaces can be minimized by independent optimization of first through third heights $H_1$ through $H_3$ by taking into account amount of exponential decay of the evanescent mode and suppression of amplitudes of the propagating mode.

There is a significant difference in modal profiles between propagating and evanescent eigenmodes in the lateral direction (x-direction in the coordinate system shown in FIG. 1C). The modal profile is defined as a complex amplitude of particle displacement given as a function of lateral (x-direction) and vertical (y-direction) directions. Propagating modes have a form of spatially periodic function, both in the central region of the FBAR 100 and inside the multi-interface frame pattern 150. By contrast, evanescent modes have a constant profile (i.e., the displacement amplitude does not depend on x-direction) in the central region of the FBAR 100 and decay exponentially in the direction away from the interface of the central region of the FBAR 100 and the first stepped structure 151.

Moreover, for typical electrical excitation, the lowest-order evanescent eigenmode contains a substantial portion (for example, ~50%) of the elastic energy compared to energy confined in other higher-order evanescent eigenmodes and in the propagating eigenmodes. However, this partitioning of energy between the various eigenmodes depends on frequency of excitation and on thicknesses and materials used in layers of the FBAR 100. In accordance with certain illustrative embodiments, the total width of the multi-interface frame pattern 150 is selected to be equal to or greater than the inverse of the attenuation constant (1/k) of the lowest order thickness extensional evanescent eigenmode in the central region of the FBAR 100 (which is approximately the same as the inverse of the attenuation constant of an analogous mode in the stepped structures comprising multi-interface pattern 150). As such, at the acoustic impedance discontinuity at the edge of the top electrode 140, the lowest order evanescent mode will have decayed sufficiently to prevent energy loss due to scattering at this interface.

Propagating eigenmodes of the stepped structure multi-interface frame pattern 150 are predominantly excited mechanically at the vertical interface between the central region of the FBAR 100 and the first stepped structure 151. The first through third stepped structures 151-153 effectively provide three (stacked) interfaces, which reflect a portion of incoming eigenmode propagating from the center of the active region in the FBAR 100. These incoming propagating eigenmodes are being excited by an electric field at all points under the top electrode 140. Upon reflection from each interface of the first through third stepped structures 151-153, the reflected eigenmode propagates in the opposite direction to the incoming eigenmode and interferes with that eigenmode either positively (when amplitudes of both eigenmodes add up) or destructively (when amplitudes of both eigenmodes subtract from each other). In general, when interfaces of the first through third stepped structures 151-153 are spaced by a distance equal to an odd multiple (1, 3, 5 . . . ) of the quarter wavelength of the incoming eigenmode, the incoming and reflected waves interfere destructively at each interface. This destructive interference leads to the exponential decrease of the total amplitude of the propagating eigenmode as it travels in the direction away from the center of the FBAR 100. In other words, the eigenmode cannot effectively propagate through such structure, and is therefore reflected back to the main part of the FBAR 100.

For example, the first through third stepped structures 151-153 may reflect incoming eigenmode with amplitude $E_{in}$ resulting in reflected eigenmode with amplitude $E_{reflect}$, as shown by arrows in FIG. 1C. The relation between incoming eigenmode amplitude $E_{in}$ and the total amplitude of the propagating eigenmode (being the sum of incoming and reflected amplitudes $E_{total}=E_{in}+E_{reflec}$) indicates the level of eigenmode suppression (when $E_{total}<E_{in}$) or enhancement (when $E_{total}>E_{in}$). In an ideal configuration, the eigenmode would be fully suppressed ($E_{reflect}=-E_{in}$ and so $E_{total}\sim 0$). Accordingly, when designed properly for maximum eigenmode suppression, the first through third stepped structures 151-153 improve the energy confinement inside the FBAR 100 which manifests itself by increased Rp and Q-factor of the FBAR 100. Also, as mentioned above, progressively increased thickness of the membrane in the first through third stepped structures 151-153 allows for a faster decrease of the TE evanescent mode, which is also being electrically excited in the FBAR 100. Minimized amplitude of the TE evanescent mode at the outside edge of the outer multi-interface frame pattern 150 minimizes scattering of the TE evanescent mode at that edge, yielding additional increase in Rp and Q-factor. Notably, the first through third stepped structures 151-153 may be used to increase Q-factor for excitation frequencies above Fs.

It is noted that the above description is a single excitation point (e.g. at the vertical interface of the central region of the FBAR 100 and the first stepped structure 151) approximation to the complete case of the propagating eigenmode excitation problem, and is given only to facilitate basic appreciation for the effects arising from the wave nature of the case considered here. As noted above, the propagating eigenmodes are continuously excited in the entire active region and as such form a diffraction pattern in the multi-interface frame pattern 150. Moreover, this diffraction pattern is further complicated by the presence of large acoustic impedance discontinuity at the edge of the top electrode 140. Numerical analysis may be required to compute and analyze the diffraction pattern formed in the FBAR 100 comprising the multi-interface frame pattern 150. Experimental optimization of the first through third widths $W_1$ through $W_3$ and/or the first through third heights $H_1$ through $H_3$ may be performed to guarantee the desired performance of the FBAR 100 over the range of operating frequencies.

In various embodiments, the ratio of height of the top electrode 140 and the height of each of the first through third stepped structures 151-153 may be between approximately 30:1 and approximately 3:1, although other ratios may be applied. In addition, the first width $W_1$ of the first stepped structure 151 may be between approximately one percent and approximately 10 percent of the length L of the top electrode 140, while the second and third widths $W_2$ and $W_3$ are each some odd multiple of the QWL less than the first width $W_1$, as discussed above. For example, when the top electrode 140 has a height $H_0$ of about 10000 Å and a length of about 100 µm, the first through third heights $H_1$ to $H_3$ of the first through third stepped structures 151-153 may each be in a range of about 300 Å to about 3000 Å, and the first width $W_1$ of the first stepped structure 151 may be in a range of about 1 µm to about 10 µm.

Generally, the thicker the first through third stepped structures 151-153 are with respect to the top electrode 140, the greater the increase in Rp of the FBAR 100 due to improved confinement and suppression of TE propagating mode. Notably however, first structure 151 will enhance the TE propagating modes excited below Fs leading to undesirable increases in Rs and decrease in Qsw. Also, as the first through third stepped structures 151-153 are made thicker, the first through third widths $W_1$ to $W_3$ of the first through third stepped structures 151-153 become more sensitive to alignment errors and the like in the fabrication process, making production more difficult. So, the first through third heights $H_1$ to $H_3$ of the first through third stepped structures 151-153 are typically selected to balance desirable increase in Rp against undesirable increase in Rs and decrease in Qsw, and undesirable increase in sensitivity of the first through third widths $W_1$ to $W_3$ to the fabrication process. Also, the first through third heights $H_1$ to $H_3$ are generally thinner for higher resonant frequencies, typically because the top electrode 140 is also thinner for higher resonant frequencies.

The FBAR 100 may be apodized or irregular in shape, and the outer multi-interface frame pattern 150 may substantially follow along the outer perimeter of the top electrode 140, as shown in FIG. 1A, for example. Of course, the FBAR 100 may be formed in alternative shapes, such as circular, square, rectangular, trapezoidal, etc., without departing from the scope of the present teachings. Also, in various embodiments, the outer multi-interface frame pattern 150 may be shaped differently from the shape of the top electrode 140, and/or the multi-interface frame pattern 150 may not be disposed along all of the edges of the top electrode 140. Likewise, FIGS. 1A-1C generally show an embodiment in which the multi-interface frame pattern 150 has the same number of stepped structures (first through third stepped structures 151-153) disposed along all edges of the top electrode 140. However, in various alternative embodiments, the number of stepped structures may differ along one or more of the edges of the top electrode 140. For example, the multi-interface frame pattern 150 along the right-most edge of the top electrode 140 may have three stepped structures, while the multi-interface frame pattern 150 along the left-most edge of the top electrode 140 may have only two stepped structures. Further, although the respective edges of the first through third stepped structures 151-153 as shown in FIGS. 1A-1C are parallel to one another, it is understood that in alternative embodiments, one or more of the first through third stepped structures 151-153 may have edges that are not parallel, with respect to the other edges of the same stepped structure and/or with respect to edges of one or more of the other stepped structures.

The first through third stepped structures 151-153 of the outer multi-interface frame pattern 150 may be formed of electrically conductive materials, such as W, Mo or Cu, for example, and may be the same material as the top electrode 140. Alternatively, one or more of the first through third stepped structures 151-153 may be formed of different materials than the top electrode 140 and/or different material from one another. Also, one or both of the first through third stepped structures 151-153 may be formed of a dielectric material, such as silicon dioxide ($SiO_2$), silicon nitride (SiN), silicon carbide (SiC), AlN, ZnO or PZT, for example.

Figure 2A:
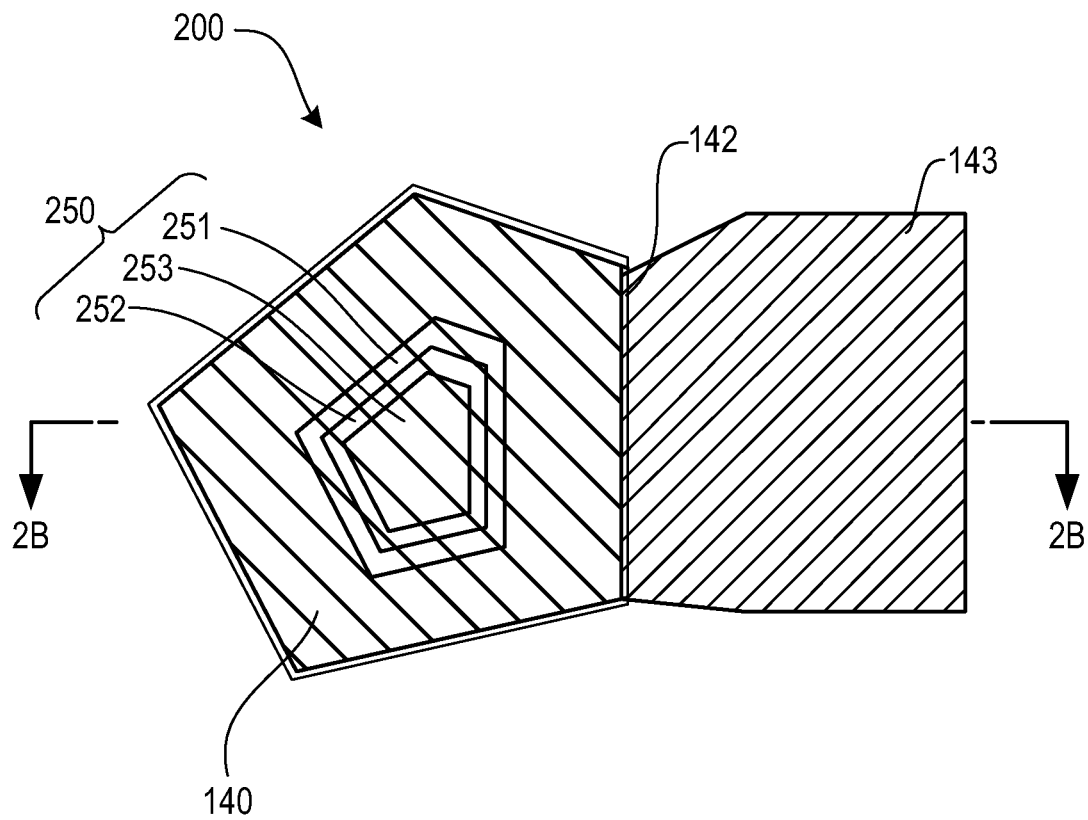
FIG. 2A is a top plan view illustrating an FBAR including an inner multi-interface frame pattern with stepped structures, according to a representative embodiment.
Figure 2B:
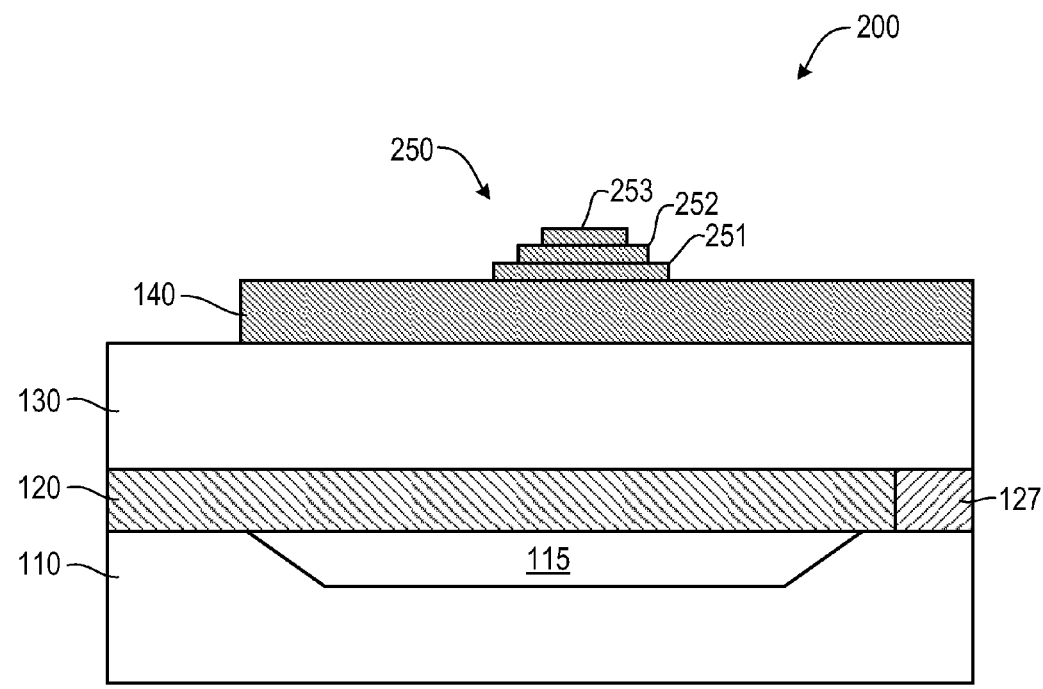
FIGS. 2B-2C are cross-sectional diagrams illustrating the FBAR of FIG. 2A, according to representative embodiments.
Figure 2C:
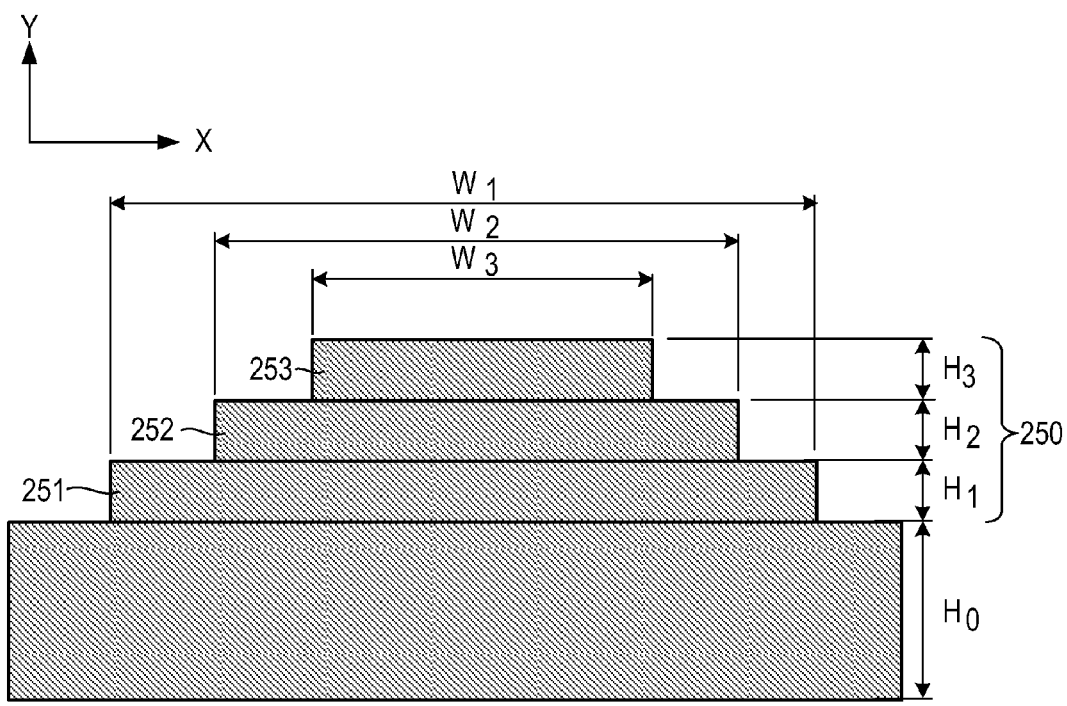

FIG. 2A shows a top view of FBAR 200 in accordance with a representative embodiment. The FBAR 200 includes a top electrode 140 having five (5) sides, with a connection side 142 configured to provide an electrical connection to interconnect 143. The interconnect 143 provides electrical signals to the top electrode 140 to excite desired acoustic waves in a piezoelectric layer (not shown in FIG. 2A) of the FBAR 200. The FBAR 200 further includes lateral features configured to suppress at least a portion of lateral acoustic waves (e.g., the eigenmode of the lateral acoustic waves) electrically excited at frequencies below Fs. As described above, if the electric field's driving frequency is larger than Fs, two kinds of eigenmodes are electrically excited: the evanescent eigenmode and the propagating eigenmode. For electric field frequencies below Fs, the evanescent eigenmode becomes a propagating eigenmode, and, moreover, it contains a major portion of acoustic energy. The lateral features shown in FIG. 2A-2C are aimed at confining and suppressing that propagating eigenmode (again, for electric field frequencies below Fs). According to a representative embodiment, the lateral features include inner multi-interface frame pattern 250, comprising stepped structures 251-253, discussed below with reference to FIGS. 2B and 2C.

FIG. 2B shows a cross-sectional view of the FBAR 200 taken along line 2B-2B of FIG. 2A in accordance with a representative embodiment. FIG. 2C is a cross-sectional view zoomed in on inner multi-interface frame pattern 250 of FIG. 2B. The FBAR 200 includes multiple layers stacked over substrate 110 having cavity 115 for reflection of acoustic waves or an acoustic reflector (e.g., a Bragg mirror (not shown)), as discussed above. The bottom electrode 120 is disposed over the substrate 110 and partially over the cavity 115, along with the planarization layer 127. The piezoelectric layer 130 is disposed over the bottom electrode 120, and the top electrode 140 is disposed over the piezoelectric layer 130. The substrate 110, the bottom and top electrodes 120 and 140, the planarization layer 127, and the piezoelectric layer 130 are substantially the same as discussed above, and therefore further detailed description will not be repeated.

The FBAR 200 also includes inner multi-interface frame pattern 250 formed on the top surface of the top electrode 140. The inner multi-interface frame pattern 250 is formed in a central region of the top electrode 140, and includes multiple stepped structures 251-253. The central region refers to a portion of the top electrode 140 that incorporates the center of the active region of the FBAR 200. The central region may extend outward toward (but not include) the so-called outer region of the FBAR 200, discussed above, by various amounts, depending on application specific design requirements of various implementations, for example. In the depicted representative embodiment, the first stepped structure 251 is stacked on the top surface of the top electrode 140, the second stepped structure 252 is stacked on the first stepped structure 251, and the third stepped structure 253 is stacked on the second stepped structure 252, forming a perimetric stair step pattern stacked in the central region of the top electrode 140, in which the stair step pattern is provided along all outer edges (or perimeter) of the inner multi-interface frame pattern 250. In various alternative configurations, the inner multi-interface frame pattern 250 may include any number of stepped structures from two to N steps, without departing from the scope of the present teachings.

Referring to FIG. 2C, the top electrode 140 has height $H_0$ (step thickness) in the y-axis direction, and the first through third stepped structures 251-253 have corresponding heights first through third heights $H_1$ to $H_3$, respectively. In the depicted representative embodiment, first height $H_1$=second height $H_2$=third height $H_3$, although the heights may differ in order to provide unique benefits for any particular situation or to meet application specific design requirements of various implementations. For example, in alternative configurations, each of the first through third stepped structures 251-253 may have different heights, such that first height $H_1$>second height $H_2$>third height $H_3$, for example, or first height $H_1$<second height $H_2$<third height $H_3$. Each of the first through third heights $H_1$ to $H_3$ may be within a range of approximately 50 Å to about 1500 Å, for example. Likewise, the first through third stepped structures 251-253 have corresponding first through third widths $W_1$ to $W_3$ in the x-axis direction, respectively. To maintain the perimetric stepped structure, first width $W_1$>second width $W_2$>third width $W_3$. In various embodiments, each of the first through third widths $W_1$ to $W_3$ is an odd multiple of a QWL of an eigenmode which desirably may be suppressed at a given excitation frequency (or for a frequency range). The total width of the outer multi-interface frame pattern 150 is the same as the first width $W_1$ of the bottom (first) stepped structure 251.

Also, in various embodiments, the ratio of height of the top electrode 140 and the height of each of the first through third stepped structures 251-253 may be between approximately 100:1 and approximately 10:1, although other ratios may be applied. In addition, the first width $W_1$ of the first stepped structure 251 may be between approximately 99 percent and approximately 80 percent of the length L of the top electrode 140, while the second and third widths $W_2$ and $W_3$ are each some odd multiple of the QWL less than the first width $W_1$, as discussed above. For example, when the top electrode 140 has a height $H_0$ of about 10000 Å and a length of about 100 μm, the first through third heights $H_1$ to $H_3$ of the first through third stepped structures 251-253 may each be in a range of about 100 Å to about 1000 Å, and the first width $W_1$ of the first stepped structure 251 may be in a range of about 99 μm to about 80 μm.

Generally, the thicker the first through third stepped structures 251-253 are with respect to the top electrode 140, the greater the beneficial decrease in Rs of the FBAR 200. However, while inner multi-interference frame pattern 250 may suppress the dominant propagating mode being excited below Fs, resulting in lower Rs. it also may enhance the propagating modes being excited at above Fs resulting in lower Rp and Q-factor in that part of the electrical spectrum. However, as the first through third stepped structures 251-253 are made thicker, the first through third widths $W_1$ to $W_3$ of the first through third stepped structures 251-253 become more sensitive to alignment errors and the like in the fabrication process, making production more difficult. In addition to process issues, increased thickness of layers in the stepped structures 251-253 may also cause degradation of the pass-band of the FBAR 200 at frequencies slightly above Fs due to electrical coupling of piston modes excited in the inner multi-interference frame pattern 250 and the main part of the membrane of the FBAR 200. Therefore, the first through third heights $H_1$ to $H_3$ of the first through third stepped structures 251-253 are typically selected to balance desirable decrease in Rs against undesirable increase in sensitivity of the first through third widths $W_1$ to $W_3$ to the fabrication process, as well as to balance the adverse decrease of Rp and possible pass-band degradation above Fs. Also, the first through third heights $H_1$ to $H_3$ are generally thinner for higher resonant frequencies, typically because the top electrode 140 is also thinner for higher resonant frequencies.

The first through third stepped structures 251-253 effectively provide three (stacked) interfaces, which suppress a portion of lateral (or transverse) acoustic waves propagating from the center of the active region in the FBAR 200. The multiple reflections from the interfaces of multi-stepped inner multi-interface frame pattern 250 may beneficially suppress of the dominant electrically excited TE eigenmode for a range of excitation frequencies below Fs. Accordingly, the first through third stepped structures 251-253 decrease the Rs of the FBAR 200 and minimize the presence of spurious-mode rattles in the electrical response of the FBAR 200 for frequencies below Fs of the FBAR 200.

The FBAR 200 may be apodized or irregular in shape, and the outer perimeter of the inner multi-interface frame pattern 250 may substantially correspond to the outer perimeter of the top electrode 140, as shown in FIG. 2A, for example. Of course, the FBAR 200 may be formed in alternative shapes, such as circular, square, rectangular, trapezoidal, etc., without departing from the scope of the present teachings. Also, in various embodiments, the inner multi-interface frame pattern 250 may be shaped differently from the shape of the top electrode 140. Also, although the respective edges of the first through third stepped structures 251-253 as shown in FIGS. 2A-2C are parallel to one another, it is understood that in various alternative embodiments, one or more of the first through third stepped structures 251-253 may have edges that or not parallel, with respect to the other edges of the same stepped structure and/or with respect to edges of one or more of the other stepped structures.

The first through third stepped structures 251-253 of the inner multi-interface frame pattern 250 may be formed of electrically conductive materials, such as W, Mo or Cu, for example, and may be the same material as the top electrode 140. Alternatively, one or more of the first through third stepped structures 251-253 may be formed of different materials than the top electrode 140 and/or different material from one another. Also, one or both of the first through third stepped structures 251-253 may be formed of a dielectric material, such as $SiO_2$, SiN, SiC, AlN, ZnO or PZT, for example.

Figure 3:
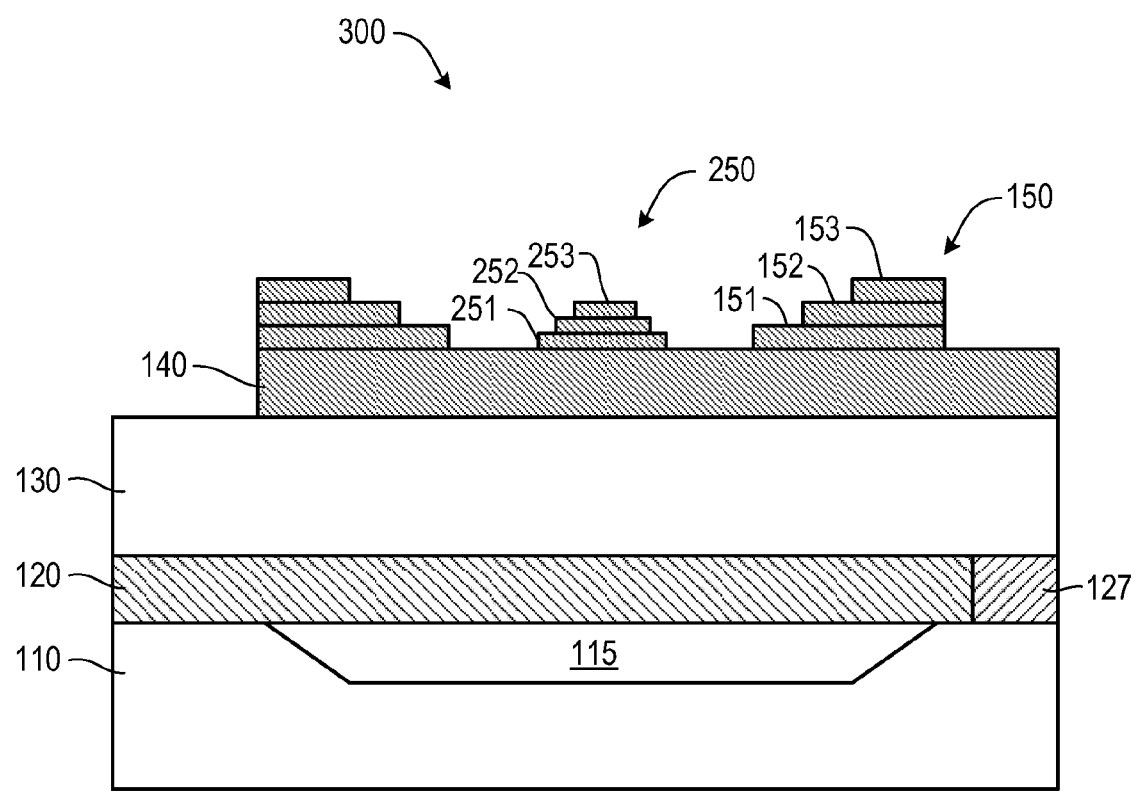
FIG. 3 is a cross-sectional diagram illustrating an FBAR including outer and inner multi-interface frame patterns with corresponding stepped structures, according to a representative embodiment.

In various embodiments, the outer and inner multi-interface frame patterns may be combined in a single FBAR, in various shapes and numbers of layers. For example, FIG. 3 shows a cross-sectional view of the FBAR 300, including both outer and inner multi-interface frame patterns 150 and 250, in accordance with a representative embodiment, where outer multi-interface frame pattern 150 comprises stepped structures 151-153 and inner multi-interface frame pattern 250 comprises stepped structures 251-253, discussed above. It is understood that top electrode 140 of the FBAR 300 would have a top plan view substantially combining the top plan views of top electrode 140 depicted in FIGS. 1A and 2A, and therefore is not separately depicted herein.

The FBAR 300 includes multiple layers stacked over substrate 110 having cavity 115 for reflection of acoustic waves or an acoustic reflector (e.g., a Bragg mirror (not shown)), as discussed above. The bottom electrode 120 is disposed over the substrate 110 and partially over the cavity 115, along with the planarization layer 127. The piezoelectric layer 130 is disposed over the bottom electrode 120, and the top electrode 140 is disposed over the piezoelectric layer 130. The substrate 110, the bottom and top electrodes 120 and 140, the planarization layer 127, and the piezoelectric layer 130 are substantially the same as discussed above, and therefore further detailed description will not be repeated.

The FBAR 300 also includes outer multi-interface frame pattern 150 and inner multi-interface frame pattern 250 formed on the top surface of the top electrode 140, where the outer multi-interface frame pattern 150 surrounds the inner multi-interface frame pattern 250. The outer multi-interface frame pattern 150 is formed in an outer region of the top electrode 140, and includes multiple stepped structures 151-153. The inner multi-interface frame pattern 250 is formed in a central region of the top electrode 140, and includes multiple stepped structures 251-253, as discussed above with reference to FBARs 100 and 200.

Although depicted as having three stepped structures each, in various alternative configurations, each of the outer multi-interface frame pattern 150 and the inner multi-interface frame pattern 250 may include any number of stepped structures from two to N steps, without departing from the scope of the present teachings. Also, the outer multi-interface frame pattern 150 and the inner multi-interface frame pattern 250 may have the same or different number of stepped structures. The heights and widths of the stepped structures 151-153 and 251-253, as well as the corresponding effects on parallel resistance Rp, series resistance Rs and Q-factor, are substantially the same as discussed above.

The outer multi-interface frame pattern 150 and the inner multi-interface frame pattern 250 may be fabricated on the top electrode 140, respectively, according to various known techniques. For example, outer multi-interface frame pattern 150 and the inner multi-interface frame pattern 250 may be fabricated according to the methods for forming inner and outer multi-interface frames described in U.S. patent application Ser. No. 13/074,094 (filed Mar. 20, 2011) to by Shirakawa et al., which is hereby incorporated by reference. However, it is understood that various steps would need to be repeated to form the multiple stepped structures (e.g., first through third stepped structures 151-153 and 251-253), respectively. In addition, various fabrication techniques of cavities in a substrate are described by U.S. Pat. No. 7,345,410 (Mar. 18, 2008) to Grannen et al., and various fabrication techniques of acoustic mirrors are described by in U.S. Pat. No. 7,358,831 (Apr. 15, 2008), to Larson III, et al. which are hereby incorporated by reference.

For example, to form the outer multi-interface frame pattern 150, multiple thin layers corresponding to the stepped structures 151-153 may be applied to the piezoelectric layer 130, using a spin-on, sputtering, evaporation or chemical vapor disposition (CVD) technique, for example, to the desired thicknesses, respectively. Each application may be followed by application of a corresponding photoresist pattern (e.g., via photolithography) and etching process (e.g., sulfur hexafluoride ($SF_6$)-based plasma etch), using the photoresist pattern as an etch mask. This provides a protruding structure, embedded in the subsequently applied top electrode 140, upon which the outer multi-interface frame pattern 150 takes its shape.

Also, for example, to form the inner multi-interface frame pattern 250, a conductive layer corresponding to the top electrode 140 is applied to the top surface of the piezoelectric layer 130 and the protruding structure, discussed above. Photoresist patterns are consecutively applied (e.g., via photolithography) to the top electrode conductive layer, each of which is followed by application of a thin layer corresponding to a first, second or third stepped structure 251-253 using a spin-on, sputtering, evaporation or CVD technique, for example, to the desired thicknesses. The photoresist patterns are removed (e.g., via wet etching using a solvent, such as NMP), resulting in portions of the corresponding thin layers deposited on the surfaces of the photoresist patterns being lifted off, either consecutively after application of each thin layer or simultaneously following application of the third thin layer. The remaining center portions of the thin layers thus become the stepped structures 251-253 of the inner multi-interface frame pattern 250. Another photoresist pattern may be formed over the structure to enable etching of the outer peripheral edges to form FBAR 300.

Notably, in various embodiments, the multiple thin layers corresponding to the stepped structures 151-153 of the outer multi-interface frame pattern 150 may be similarly formed using consecutively applied photoresist patterns and thin layers of the desired thicknesses, as discussed above with regard to formation of the stepped structures 251-253. Such a process is particularly available when the FBAR includes only an outer multi-interface frame pattern 150 or the outer and inner multi-interface frame patterns 150 and 250 include the same number of thin layers (and corresponding stepped structures) having the same respective thicknesses.

Figure 4:
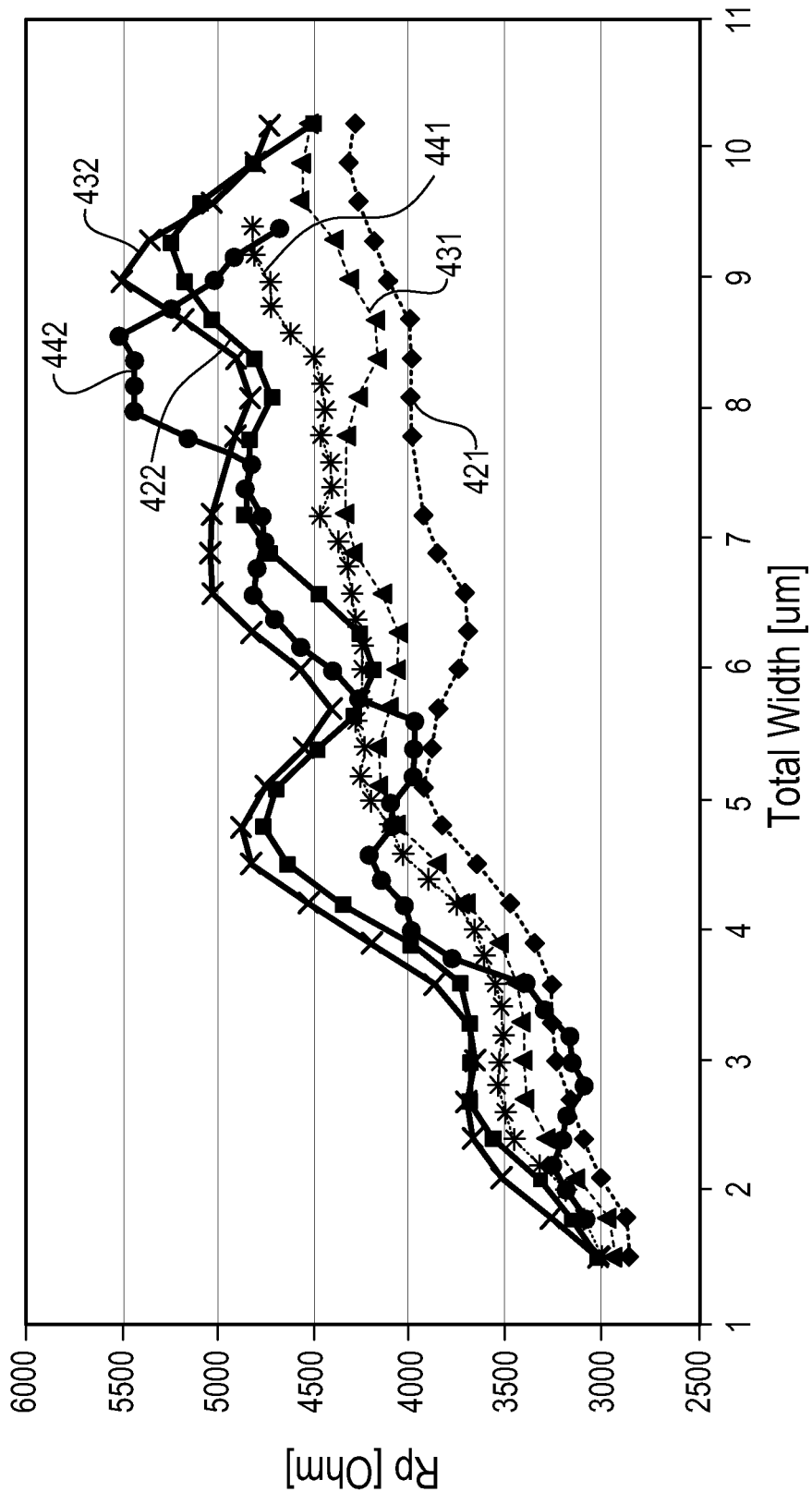
FIG. 4 is a graph illustrating parallel resistance versus widths of outer multi-interface frame patterns, according to a representative embodiment.

FIG. 4 is a graph illustrating parallel resistance versus total width of outer multi-interface frame pattern, for various step thicknesses, according to a representative embodiment.

Referring to FIG. 4, traces 421 and 422 show outer multi-interface frame patterns with two stepped structures having total widths (i.e., the width corresponding to the first or bottom stepped structure) of 1500 Å and 3000 Å, respectively; traces 431 and 432 show outer multi-interface frame patterns with three stepped structures (e.g., as shown in FIG. 1B) having total widths of 1500 Å and 3000 Å, respectively; and traces 441 and 442 show outer multi-interface frame patterns with four stepped structures having total widths of 1500 Å and 3000 Å, respectively. The traces 421, 422, 431, 432, 441 and 442 indicate that there are two components to parallel resistance dependence on of the total width of the outer multi-interface frame pattern. The first component is related to improved exponential decay of the electrically excited TE evanescent mode and the results in a continuous increase of Rp as the total width of the outer multi-interface frame pattern increases. The second component is related to the periodic suppression and enfacement of the electrically excited TE propagating mode upon multiple reflections of that mode from the interfaces of the multi-interface frame pattern 150, and corresponds to periodic peaks and valleys in Rp values. Therefore in addition to being monotonically increasing, Rp is also a periodic function of the total width of the outer multi-interface frame pattern, with a period of approximately 2.5 µm in the depicted example. In addition, by comparing step thickness for each set of outer multi-interface frame patterns having the same number of stepped structures, it is apparent that Rp generally increases more in response to the thicker stepped structures (e.g., 3000 Å) than the thinner stepped structures (e.g., 1500 Å).

In the depicted example, the highest Rp (and thus most desirable) is obtained using an outer multi-interface frame pattern with four stepped structures, where the total width of the outer multi-interface frame pattern is about 8.7 µm and the step thickness is 3000 Å, followed closing by an outer multi-interface frame pattern with three stepped structures, where the total width of the outer multi-interface frame pattern is about 9.0 µm and the step thickness is 3000 Å. However, the number of step structures needed to obtain the highest Rp varies with the width of the outer multi-interface frame pattern. For example, according to FIG. 4, outer multi-interface frame patterns with only two or three stepped structures generally provide higher Rp than outer multi-interface frame patterns with four stepped structures until the total width of the outer multi-interface frame pattern exceeds about 5.5 µm, and outer multi-interface frame patterns with only three stepped structures continue to provide higher Rp than outer multi-interface frame patterns with four stepped structures until the total width of the outer multi-interface frame pattern exceeds about 7.5 µm.

It is understood that the specific configurations of the FBARs 100, 200 and 300, discussed above, are illustrative, and that the various parameters and characteristics described herein may vary to provide unique benefits for any particular situation or to meet application specific design requirements. Further, various combinations of inner and outer multi-interface frame patterns may be incorporated, without departing from the scope of the present teachings. For example, inner and outer multi-interface frame patterns 150 and 250 may be formed on the bottom electrode 120 instead of or in addition to the inner and outer multi-interface frame patterns 150 and 250 formed on the top electrode 140. Other examples include any combination of inner multi-interface frame patterns and outer multi-interface frame patterns formed on the electrodes. For example, the top electrode 140 may include only inner multi-interface frame pattern 250, while the bottom electrode 120 may include only outer multi-interface frame pattern 150.

Notably, the teachings of the incorporated patents and patent applications are intended to be illustrative of methods, materials and structures useful to the present teachings, but in no way limiting to the present teachings. The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A thin film bulk acoustic resonator (FBAR), comprising:
a first electrode on a substrate over a cavity;
a piezoelectric layer on the first electrode;
a second electrode on the piezoelectric layer;
a plurality of lateral features on a surface of the second electrode, the plurality of lateral features comprising a plurality of stepped structures, having different widths, consecutively stacked on the second electrode.

2. The FBAR of claim 1, wherein the plurality of lateral features comprise an outer multi-interface frame pattern located at an outer region of the second electrode, the outer multi-interface frame pattern comprising the plurality of stepped structures.

3. The FBAR of claim 2, wherein the outer multi-interface frame pattern is configured to reflect at least a portion of thickness extensional (TE) propagating mode excited in the FBAR, increasing a parallel resistance of the FBAR.

4. The FBAR of claim 2, wherein at least one stepped structure of the plurality of stepped structures is formed of a dielectric material.

5. The FBAR of claim 2, wherein at least one stepped structure of the plurality of stepped structure has an edge that is not parallel to an edge of at least one other stepped structure of the plurality of stepped structures.

6. The FBAR of claim 2, wherein the outer multi-interface frame pattern comprises a different number of stepped structures along one edge of the electrode than along a different edge of the electrode.

7. The FBAR of claim 2, wherein a height of each of the stepped structures is in a range of about 200 Å to about 5000 Å.

8. The FBAR of claim 7, wherein a width of each of the stepped structures is an odd integer multiple of a quarter wavelength of a propagating eigenmode excited at a resonant frequency of the FBAR.

9. The FBAR of claim 1, wherein the plurality of lateral features comprise an inner multi-interface frame pattern located at a center region of the second electrode, the inner multi-interface frame pattern comprising the plurality of stepped structures.

10. The FBAR of claim 9, wherein at least one stepped structure of the plurality of stepped structures is formed of a dielectric material.

11. The FBAR of claim 9, wherein at least one stepped structure of the plurality of stepped structure has an edge that is not parallel to an edge of at least one other stepped structure of the plurality of stepped structures.

12. The FBAR of claim 9, wherein a height of each of the stepped structures is in a range of about 50 Å to about 1500 Å.

13. The FBAR of claim 12, wherein the inner multi-interface frame pattern is configured to suppress at least a portion of thickness extensional (TE) propagating lateral acoustic mode, decreasing a series resistance of the FBAR.

14. A thin film bulk acoustic resonator (FBAR), comprising:
a first electrode on a substrate;
a piezoelectric layer on the first electrode;
a second electrode on the piezoelectric layer;
an outer multi-interface frame pattern on a surface of the second electrode at an outer region of the second electrode, the outer multi-interface frame pattern comprising a plurality of first stepped structures, having different widths, consecutively stacked on the second electrode; and
an inner multi-interface frame pattern on the surface of the second electrode at a center region of the second electrode, the inner multi-interface frame pattern comprising a plurality of second stepped structures, having different widths, consecutively stacked on the second electrode.

15. The FBAR of claim 14, wherein the number of first stepped structures is the same as the number of second stepped structures.

16. The FBAR of claim 15, wherein respective thicknesses of the first stepped structures are greater than respective thickness of corresponding second stepped structures.

17. The FBAR of claim 14, wherein the number of first stepped structures is different from the number of second stepped structures.

18. The FBAR of claim 14, wherein the first electrode is stacked over a cavity formed in the substrate, and wherein parallel resistance of the FBAR increases with increases in thickness of the first stepped structures, and series resistance of the FBAR decreases with increases in thickness of the second stepped structures.

19. The FBAR of claim 14, wherein the first electrode is stacked over an acoustic reflector formed in the substrate, and
wherein parallel resistance of the FBAR increases with increases in thickness of the second stepped structures, and serial resistance of the FBAR decreases with increases in thickness of the first stepped structures.

20. A bulk acoustic wave (BAW) resonator, comprising:
an electrode stacked on a piezoelectric layer of the BAW resonator; and
at least one of an outer multi-interface frame pattern at an outer region of the second electrode and an inner multi-interface frame pattern at a center region of the second electrode,
wherein the outer multi-interface frame pattern comprises a plurality of first stacked stepped structures having different widths and the inner multi-interface frame pattern comprises a plurality of second stacked stepped structures having different widths, and
wherein at least one of the first and second stacked stepped structures of one of the outer multi-interface frame pattern and the inner multi-interface frame pattern is formed of a dielectric material.

\* \* \* \* \*